United States Patent
Mochizuki et al.

(10) Patent No.: US 11,307,376 B2
(45) Date of Patent: Apr. 19, 2022

(54) OPTICAL MODULE

(71) Applicant: MITSUBISHI ELECTRIC CORPORATION, Tokyo (JP)

(72) Inventors: Keita Mochizuki, Tokyo (JP); Yoshiya Sato, Tokyo (JP); Mizuki Shirao, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/014,660

(22) Filed: Sep. 8, 2020

(65) Prior Publication Data

US 2020/0400913 A1     Dec. 24, 2020

Related U.S. Application Data (63) Continuation of application No. PCT/JP2018/014571, filed on Apr. 5, 2018.

(51) Int. Cl.
| | |
|---|---|
| *G02B 7/02* | (2021.01) |
| *H04B 10/50* | (2013.01) |
| *H04B 10/60* | (2013.01) |

(52) U.S. Cl.
CPC .......... *G02B 7/028* (2013.01); *G02B 7/025* (2013.01); *H04B 10/50* (2013.01); *H04B 10/60* (2013.01)

(58) Field of Classification Search
None
See application file for complete search history.

(56) References Cited

U.S. PATENT DOCUMENTS

| | | | | |
|---|---|---|---|---|
| 5,917,634 A | * | 6/1999 | Otobe ................ | H04B 10/1143 398/201 |
| 2010/0028021 A1 | * | 2/2010 | Shimada ............. | H04B 10/11 398/172 |

FOREIGN PATENT DOCUMENTS

| | | | |
|---|---|---|---|
| JP | 2003279825 A | * | 10/2003 |
| JP | 2007-219337 A | | 8/2007 |
| JP | 2008-250002 A | | 10/2008 |
| JP | 2009-75343 A | | 4/2009 |

* cited by examiner

*Primary Examiner* — Darren E Wolf
(74) *Attorney, Agent, or Firm* — Birch, Stewart, Kolasch & Birch, LLP (57) ABSTRACT

An optical module includes: a first lens and a second lens provided between a light emitter and a light receiver; and a base member on which the light emitter and the light receiver are placed, and each of the first lens and the second lens is fixed via an adhesive resin. A first bonding direction in which a first bonding surface of the first lens is bonded and fixed via an adhesive resin, and a second bonding direction in which a second bonding surface of the second lens is bonded and fixed via an adhesive resin are respectively perpendicular to an optical axis direction of light, and an orientation of the first bonding surface and an orientation of the second bonding surface make are different from each other.

6 Claims, 7 Drawing Sheets

OPTICAL MODULE

CROSS REFERENCE TO RELATED APPLICATION

This application is a Continuation of PCT International Application No. PCT/JP2018/014571, filed on Apr. 5, 2018, which is hereby expressly incorporated by reference into the present application.

TECHNICAL FIELD

The present invention relates to an optical module comprising a light emitter, a light receiver and a plurality of lenses.

BACKGROUND ART

As technologies that satisfy requirements of size reduction, low power consumption, and low cost on optical communication devices, a technology of integrating a plurality of functions into one package has received attentions. For example, there is a multi-lane integrated optical transmission module. The multi-lane integrated optical transmission module includes a plurality of semiconductor lasers configured to emit signal light beams of different wavelengths, and is configured to multiplex the signal light beams into one exit light. There is also a multi-lane integrated optical reception module. The multi-lane integrated optical reception module has integrated therein a plurality of light receiving elements configured to demultiplex signal light obtained by multiplexing multiple wavelengths into signal light beams of different wavelengths, and then convert the demultiplexed signal light beams into electric signals. There is also an optical transmission module having integrated therein a wavelength tunable semiconductor laser configured to output continuous light of any wavelength and an optical modulator element, typically, an MZ-type phase modulator.

One important objective in the field of optical modules is to achieve highly efficient optical coupling between a plurality of functional components. In this regard, a main factor that causes deterioration of coupling efficiency is deviation of a mounting position of each functional component such as a semiconductor laser or an optical modulator element, or an optical component such as a lens, an optical filter, or an optical fiber. In particular, in semiconductor devices, a spot size of a waveguide for incident/exit light is small, and hence slight positional deviation of a lens in the waveguide for incident/exit light leads to considerable deterioration of coupling efficiency. When a lens is mounted by an adhesive resin, the volume of resin is inevitably changed due to curing shrinkage and change over time.

The coupling efficiency refers to a ratio of an amount of incident light on a light receiver to an amount of exit light from a light source.

As a solution to achieve the above-mentioned objective, in a bonding and fixing method for an optical component and an optical apparatus described in Patent Literature 1, when a lens is to be fixed by an adhesive resin, an amount of variation accompanying curing shrinkage of the adhesive resin is estimated, and the lens is offset in advance and mounted to the optical apparatus. Further, a base to which the lens is to be fixed is provided so as to be sandwiched between at least two other fixed bases. With this structure, a loss of incident light intensity can be reduced between optical components.

Further, in a bonding and fixing method for an optical component described in Patent Literature 2, a lens unit is fixed through intermediation of a support member having bonding surfaces on its two different surfaces. This structure allows the lens unit to be fixed after being freely adjusted in position with respect to the semiconductor laser.

CITATION LIST

Patent Literatures

[PTL 1] JP 2008-250002 A
[PTL 2] JP 2007-219337 A

SUMMARY OF INVENTION

Technical Problem

The bonding and fixing method for an optical component described in Patent Literature 1 suppresses the positional variation of the lens accompanying the change of volume of the adhesive resin. However, this method requires two fixed bases for one lens and therefore has the following problem. That is, process and mechanism for positional adjustment between the lens and the bases are complicated, and hence the implementing cost is increased.

Patent Literature 2 discloses a technology that a lens can be freely adjusted in position with respect to the semiconductor laser. With the bonding and fixing method for an optical component described in Patent Literature 2, it is possible to suppress the positional deviation of the optical component due to curing shrinkage and change over time of the adhesive resin by reducing the thickness of the adhesive resin below the lens. However, the thickness of the resin cannot be reduced to "0", and hence it is difficult to completely overcome the positional deviation of the lens accompanying the change of volume of the resin. Further, in order to reduce the thickness of the resin, there is no choice but to use a low-viscosity resin, which narrows the range of choice for the resin. There is another problem in that process and mechanism for positional adjustment between the lens and the base are complicated, and hence implementing cost increased.

The present invention has been made to solve the above-mentioned problems, and therefore has an object to provide an optical module capable of achieving high coupling efficiency with a simple lens mounting structure.

Solution to Problem

In order to solve the above-mentioned problems, according to at least one embodiment of the present invention, there is provided an optical module, comprising:

a light emitter configured to emit a light;

a light receiver configured to receive the light emitted from the light emitter;

a first lens and a second lens, which are provided between the light emitter and the light receiver, and which are aligned in an optical axis direction of the light emitted from the light emitting unit; and a base member on which the light emitter and the light receiver are placed, and each of the first lens and the second lens is fixed via an adhesive resin, wherein the first lens has a first bonding surface to be fixed to the base member via an adhesive resin, wherein the second lens has a second bonding surface to be fixed to the base member via an adhesive resin, wherein a first bonding direction being a stacking direction of the first bonding surface of the first lens and the adhesive resin, and a second bonding direction being a stacking direction of the second bonding surface of the second lens and the adhesive resin are respectively perpendicular to the optical axis direction of the light, and wherein an orientation of the first bonding surface and an orientation of the second bonding surface are different from each other.

Advantageous Effects of Invention

According to the optical module of the present invention, deterioration of coupling efficiency is suppressed with a simple lens mounting structure, and hence high coupling efficiency can be achieved.

DESCRIPTION OF EMBODIMENTS

Embodiments of the present invention are described below with reference to the accompanying drawings.

In the following description, the term "direction" conceptually refers to a straight line in three dimensions, and the term "orientation" conceptually encompasses information on which side a target object is heading to on the straight line in addition to the information on the direction. That is, the "direction" is indicated by a straight line having opposite orientations, and the "orientation" is indicated by an arrow having one arrow head.

First Embodiment

Figure 1:
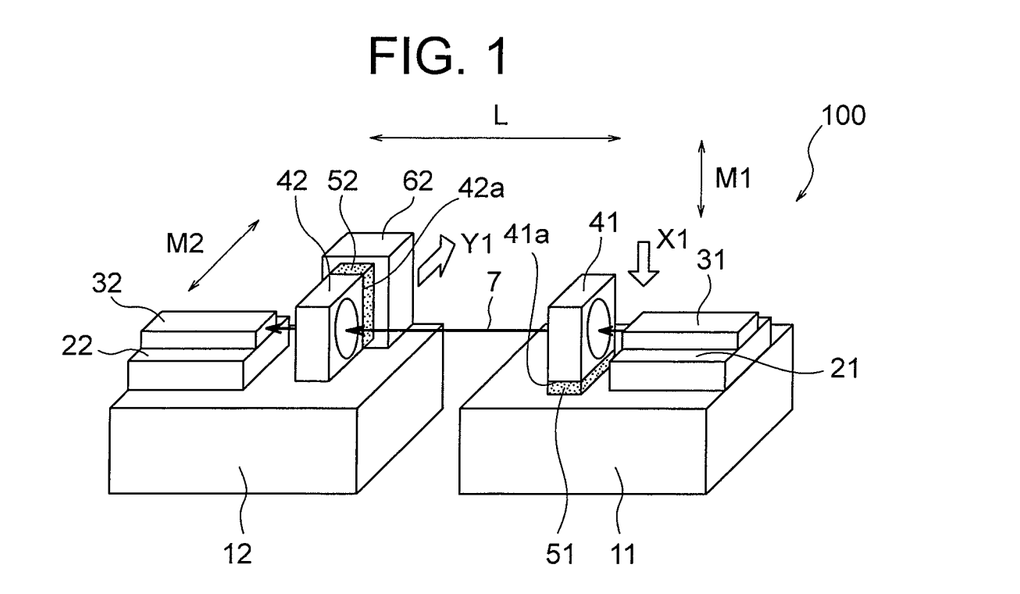
FIG. 1 is a schematic view for illustrating an optical module according to a first embodiment of the present invention.

FIG. 1 is a schematic view for illustrating a configuration of an optical module 100 according to a first embodiment of the present invention.

As illustrated in FIG. 1, the optical module 100 comprises a first substrate 11 and a second substrate 12, and a submount substrates 21 mounted on the first substrate 11 and a submount substrates 22 mounted on the second substrate 12. In this example, the submount substrates 21 and 22 are formed of for example AlN or alumina. On the submount substrate 21 mounted on the first substrate 11, a semiconductor laser 31 is provided. On the submount substrate 22 mounted on the second substrate 12, an optical modulator element 32 is provided. That is, the semiconductor laser 31 is placed on the first substrate 11 through the submount substrate 21, and the optical modulator element 32 is placed on the second substrate 12 through the submount substrate 22. The semiconductor laser 31 is configured to emit a light 7, and the light 7 is received by the optical modulator element 32. In this example, an optical axis direction L of the light 7 corresponds to a travel direction of the light 7 as well as an extending direction of the optical axis of the light 7.

The first and second substrates 11 and 12 and the submount substrates 21 and 22 constitute a base member. The base member may not be constituted of a plurality of members, and may be a single member.

Further, the semiconductor laser 31 constitutes a light emitter, and the optical modulator element 32 constitutes a light receiver.

Between the semiconductor laser 31 and the optical modulator element 32, a first lens 41 and a second lens 42 are provided, which are configured to optically couple the semiconductor laser 31 with the optical modulator element 32. The first lens 41 and the second lens 42 are aligned in the optical axis direction L of the light 7 emitted from the semiconductor laser 31, and the light 7 passes through the first lens 41 and the second lens 42. The first lens 41 is mounted on the first substrate 11, and the second lens 42 is mounted on the second substrate 12. A post 62 is provided on the second substrate 12. In this example, an adhesive resin 51 is provided on the lower surface of the first lens 41. The first lens 41 is bonded and fixed to the first substrate 11 via the adhesive resin 51. The surface of the first lens 41, on which the adhesive resin 51 is provided, is defined as a "first bonding surface 41a". Further, the second lens 42 is bonded and fixed to the post 62 via an adhesive resin 52. That is, the second lens 42 is connected to the second substrate 12 through the adhesive resin 52 and the post 62. The surface of the second lens 42, on which the adhesive resin 52 is provided, is defined as a "second bonding surface 42a". In this example, the orientation of the first bonding surface 41a of the first lens 41 is defined as "X1". The direction, to which the first bonding surface 41a of the first lens 41 is bonded and fixed, is defined as a "first bonding direction M1". Further, the orientation of the second bonding surface 42a of the second lens 42 is defined as "Y1". The direction, to which the second bonding surface 42a of the second lens 42 is bonded and fixed, is defined as a "second bonding direction M2". The first bonding direction M1 and the second bonding direction M2 are respectively perpendicular to the optical axis direction L of the light 7. Further, the orientation X1 and the orientation Y1 make an angle of 90°.

The post 62 constitutes a part of the base member.

The bonding direction is defined as a stacking direction of the bonding surface of the lens and the adhesive resin for bonding and fixing said bonding surface. Thus, the first bonding direction M1 is a stacking direction of the first bonding surface 41a of the first lens 41 and the adhesive resin 51 for bonding and fixing said first bonding surface 41a. Further, the second bonding direction M2 is a stacking direction of the second bonding surface 42a of the second lens 42 and the adhesive resin 52 for bonding and fixing said second bonding surface 42a.

As described above, in the optical module 100 according to the first embodiment, the first bonding direction M1 of the first lens 41 and the second bonding direction M2 of the second lens 42 are respectively perpendicular to the optical axis direction L of the light 7. Further, the orientation X1 of the first bonding surface 41a and the orientation Y1 of the second bonding surface 42a are different from each other. Thus, even if the volumes of the adhesive resins 51 and 52 change due to curing shrinkage or change over time of the adhesive resins 51 and 52, and then the positional deviations of the first lens 41 and the second lens 42 occur, the loss of incident light intensity can be reduced. It is therefore possible to suppress the deterioration of coupling efficiency between the semiconductor laser 31 and the optical modulator element 32.

Figure 2:
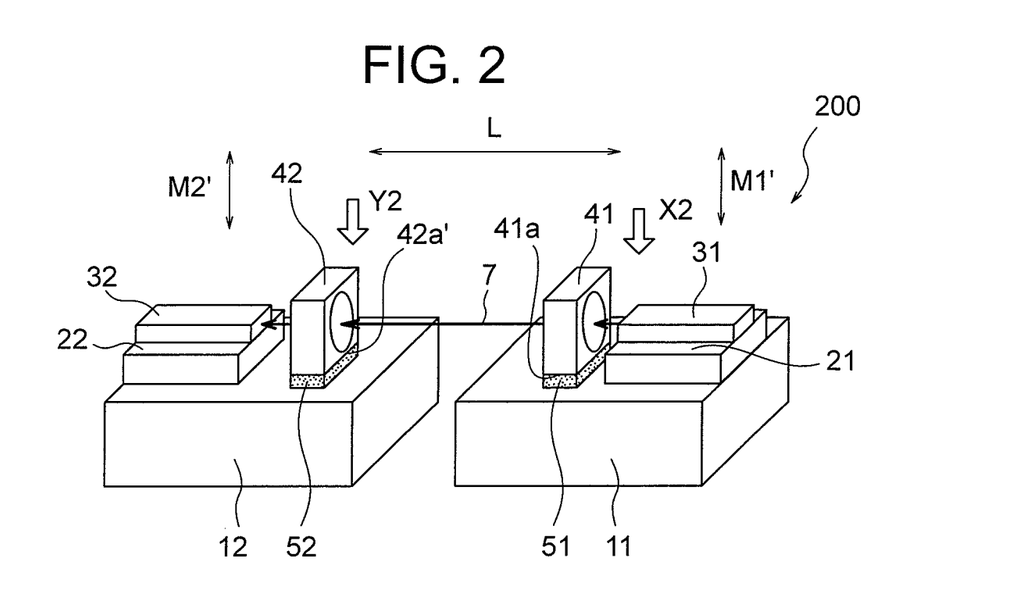
FIG. 2 is a schematic view for illustrating a related-art optical module.

Hereinafter, a description is given below of an advantageously effect of successfully suppressing the deterioration of coupling efficiency between the semiconductor laser 31 and the optical modulator element 32 thanks to the structure of the optical module 100. For the sake of comparison, FIG. 2 illustrates a configuration of a related-art optical module 200. The same reference symbols as those of FIG. 1 denote identical or similar structures, and thus descriptions thereof are omitted.

The related-art optical module 200 is different from the optical module 100, in that the orientation X2 of the first bonding surface 41a of the first lens 41 is identical with the orientation Y2 of a second bonding surface 42a' of the second lens 42. A bonding direction M1' of the first lens 41 of the optical module 200 and a bonding direction M2' of the second lens 42 of the optical module 200 are respectively identical with the first bonding direction M1 of the first lens 41 of the optical module 100, and are respectively perpendicular to the optical axis direction L of the light 7. Specifically, in FIG. 2, the first lens 41 is fixed to the first substrate 11 by applying the adhesive resin 51 to its lower part corresponding to the orientation X2. Similarly, the second lens 42 is fixed to the second substrate 12 by applying the adhesive resin 52 to its lower part corresponding to the orientation Y2.

Figure 3:
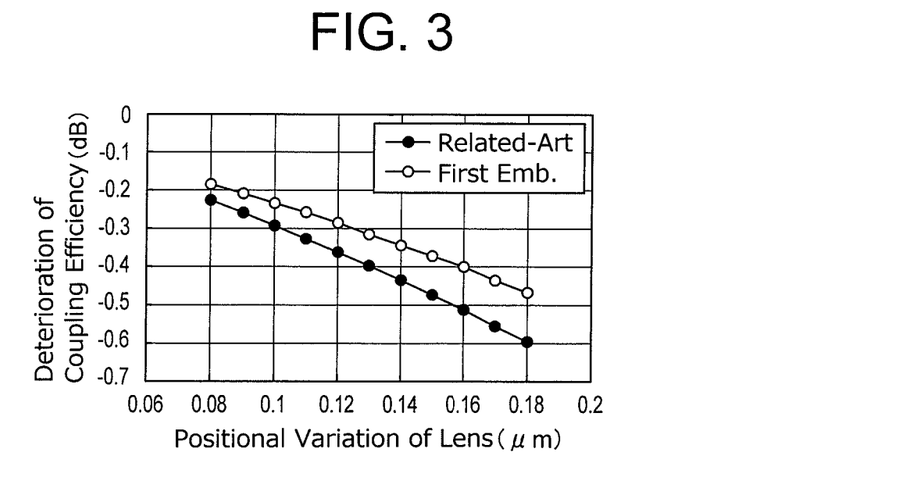
FIG. 3 is a graph for comparison of change in coupling efficiency between the optical module of FIG. 1 and the related-art optical module of FIG. 2.

FIG. 3 is a graph for showing calculation results of the deterioration of coupling efficiency between the semiconductor laser 31 and the optical modulator element 32, which accompanies positional variations of the first lens 41 and the second lens 42. In the graph, the optical module 100 of FIG. 1 and the related-art optical module 200 of FIG. 2 are compared.

As shown in FIG. 3, when the amount of positional variation of the lens is 0.1 μm in the first lens 41 or in the second lens 42, the deterioration of coupling efficiency is −0.3 dB in the related-art optical module 200, whereas the deterioration of coupling efficiency is suppressed to −0.23 dB in the optical module 100 according to the first embodiment. When the amount of positional variation of the lens is 0.16 μm, the deterioration of coupling efficiently is −0.5 dB in the related-art optical module 200, whereas the deterioration of coupling efficiency is suppressed to −0.4 dB in the optical module 100.

As understood from the above, in view of optical coupling, the related-art structure, in which the lenses are moved with the same orientation in the direction perpendicular to the optical axis direction L of the light 7, is the largest factor that causes deterioration. Thus, the first embodiment achieves improvement in terms of the amount of deterioration.

In the graph of the calculation results in FIG. 3, it is assumed that the amount of positional variation of the first lens 41 is identical with that of the second lens 42. In general, as to an adhesive resin, curing shrinkage and change over time are variations in a direction of the adhesive resin shrinking. Thus, the direction of the positional variation is assumed to be the direction in which each of the adhesive resins 51 and 52 is applied. Further, this calculation considers only curing shrinkage and change over time of the adhesive resins 51 and 52. However, also in a case of considering for example expansion at high temperature, the adhesive resins 51 and 52 are basically moved in the same direction, and hence similar effects are obtained.

Figure 4:
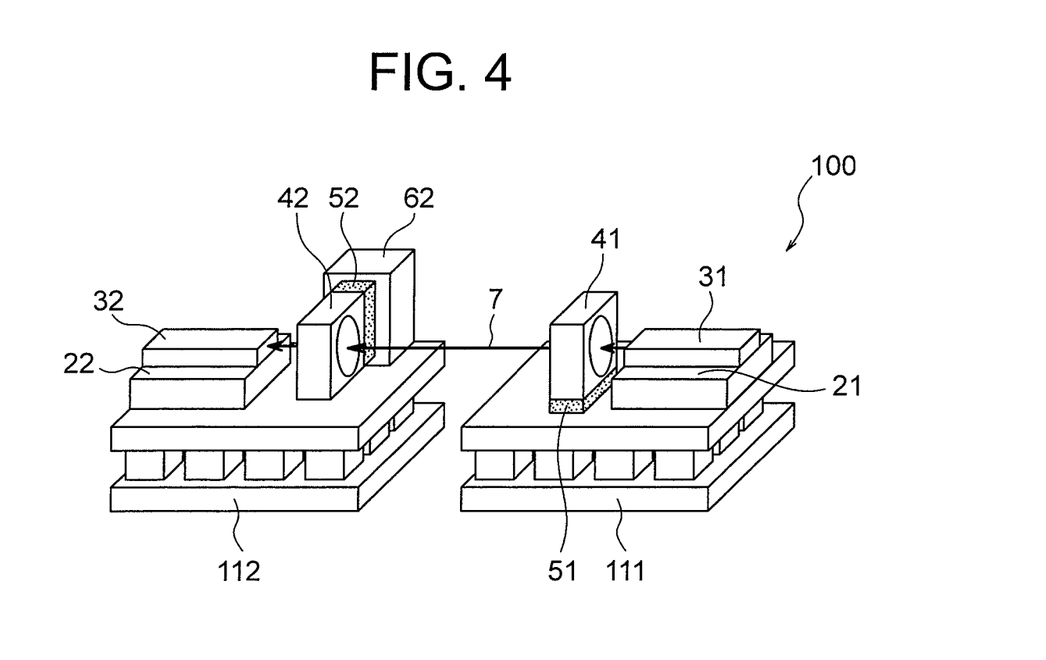
FIG. 4 is a schematic view for illustrating a modification example of the optical module of FIG. 1.
Figure 5:
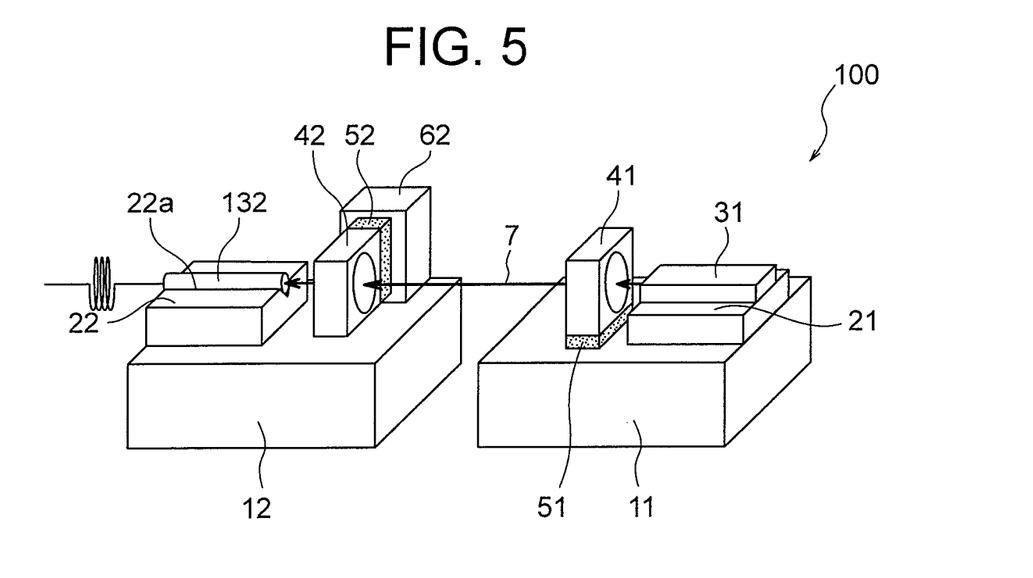
FIG. 5 is a schematic view for illustrating a modification example of the optical module of FIG. 1.

The configuration of the optical module 100 according to the first embodiment is not limited to the configuration in FIG. 1. FIG. 4 and FIG. 5 are each a schematic view for illustrating a modification example of the optical module 100.

The first substrate 11 and the second substrate 12 may be made of a ceramic material such as alumina or AlN, or made of glass such as quartz, or made of metal, or made of a functional member such as a thermo-electric cooler (TEC). For example, as illustrated in FIG. 4, when the optical module 100 comprises TECs 111 and 112 as the base member in place of the first substrate 11 and the second substrate 12, the semiconductor laser 31 and the optical modulator element 32 can be driven at more preferred temperature by a temperature adjustment function of the TECs 111 and 112. In addition, the first lens 41 and the second lens 42 can be set closer to more preferred positions by adjusting expansion and shrinkage amounts of the adhesive resins 51 and 52 depending on the temperature.

Also, the materials of the submount substrates 21 and 22 are not limited to a ceramic material such as alumina or AlN. The materials of the submount substrates 21 and 22 may be glass such as quartz or may be metal. Further, when the materials of the submount substrates 21 and 22 as the base member have a high heat conductivity equal to or higher than about 100 W/m/K like metal or AlN, the heat generated in the semiconductor laser 31 and the optical modulator element 32 can be efficiently released. In addition, an excessive expansion of the adhesive resins 51 and 52 due to an effect of temperature rising caused by the heat generation in the semiconductor laser 31 and the optical modulator element 32 is avoided.

Further, the light emitter and the light receiver of the optical module 100 are not limited to the combination of the semiconductor laser 31 and the optical modulator element 32, and may be for example a combination of a semiconductor laser and an optical fiber. Further, the combination of the light emitter and the light receiver may be a combination of a semiconductor laser and a light receiving element, or a combination of an optical fiber and a light receiving element. In this example, as illustrated in FIG. 5, when an optical fiber 132 is used as the light receiver, it is required to form in the submount substrate 22 a groove 22a having a V shape in cross section, and then fix the optical fiber 132 to the groove 22a. The optical fiber 132 can be fixed by welding to the submount substrate 22 made of metal.

The post 62 may be integrally formed with the second substrate 12, or may be formed of another member different from the second substrate 12. When the post 62 and the second substrate 12 are integrally formed, its implementing step is simplified, and hence the cost can be saved. When the post 62 is fixed as another member with respect to the second substrate 12, the position of the post 62 can be adjusted at the same time as the positional adjustment of the first lens 41 and the second lens 42. With this, it is possible to reduce the thickness of the adhesive resin 52, and suppress the amount of variation of the second lens 42 accompanying curing shrinkage and change over time of the adhesive resin 52. When the post 62 is formed of another member, the post 62 can be fixed to the second substrate 12 by a method not using an adhesive resin, for example welding or solder-joining. In this case, it is possible to prevent any variation of the second lens 42 in directions except for the direction in which the adhesive resin 52 is applied, i.e. the second bonding direction M2. And thus, it is possible to suppress the deterioration of coupling efficiency of the optical module 100.

Further, as to the first lens 41 and the second lens 42, the directions and the orientations, in which the adhesive resins 51 and 52 are applied, are not limited to those of FIG. 1. They can be any direction and orientation perpendicular to the optical axis direction L of the light 7.

Second Embodiment

Figure 6:
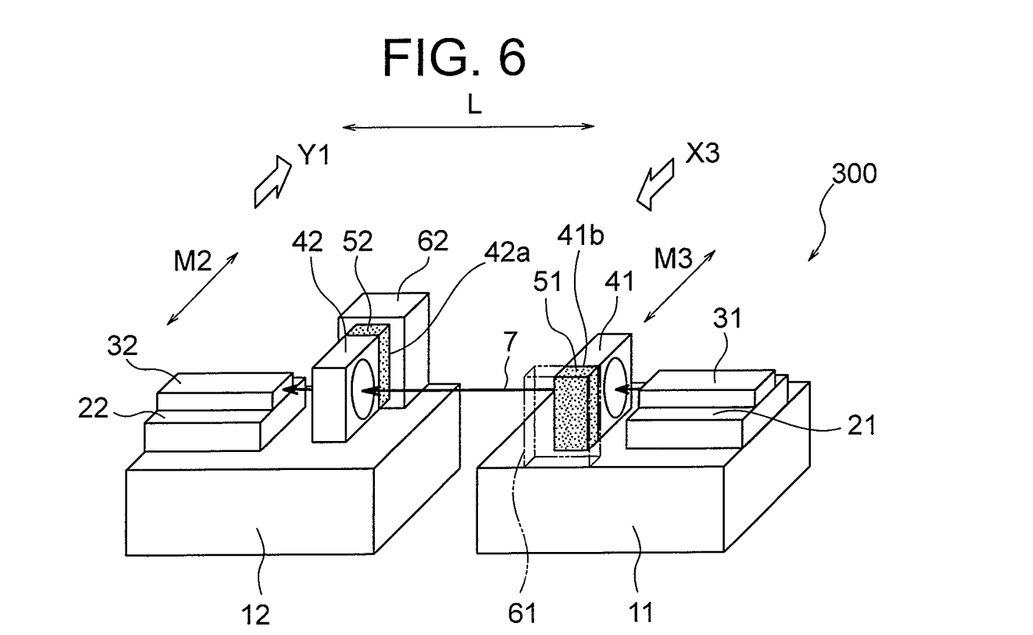
FIG. 6 is a schematic view for an optical module according to a second embodiment of the present invention.

FIG. 6 is a schematic view for illustrating a configuration of an optical module 300 according to a second embodiment of the present invention. The same reference symbols as those of FIG. 1 denote identical or similar components, and thus detailed descriptions thereof are omitted below.

As illustrated in FIG. 6, a post 61 is provided on the first substrate 11. Further, the first lens 41 is bonded and fixed to the post 61 via the adhesive resin 51 which is applied to a first bonding surface 41b of the first lens 41.

The post 61 constitutes a part of the base member.

The orientation of the first bonding surface 41b of the first lens 41 of the optical module 300 is defined as "X3", and the bonding direction of the first bonding surface 41b of the first lens 41 is defined as a "first bonding direction M3". The first bonding direction M3 of the first lens 41 is identical with the second bonding direction M2 of the second lens 42, and which is perpendicular to the optical axis direction L of the light 7. Further, the orientation X3 of the first bonding surface 41b and the orientation Y1 of the second bonding surface 42a make an angle of 180°.

As described above, in the optical module 300 according to the second embodiment, the first bonding direction M3 of the first lens 41 is identical with the second bonding direction M2 of the second lens 42, and they are respectively perpendicular to the optical axis direction L of the light 7. Further, the orientation X3 of the first bonding surface 41b and the orientation Y1 of the second bonding surface 42a make an angle of 180°. Specifically, as illustrated in FIG. 6, the first bonding surface 41b of the first lens 41 is located on the left side of the optical axis of the light 7 in a travel direction of the light 7. Meanwhile, the second bonding surface 42a of the second lens 42 is located on the right side of the optical axis of the light 7 in a travel direction of the light 7. Thus, in the optical module 300, an effect of positional deviation of the first lens 41 due to the shrinkage of the adhesive resin 51 and an effect of positional deviation of the second lens 42 due to the shrinkage of the adhesive resin 52 are cancelled out. It is therefore possible to suppress the deterioration of coupling efficiency more efficiently than in the optical module 100 of the first embodiment.

Figure 7:
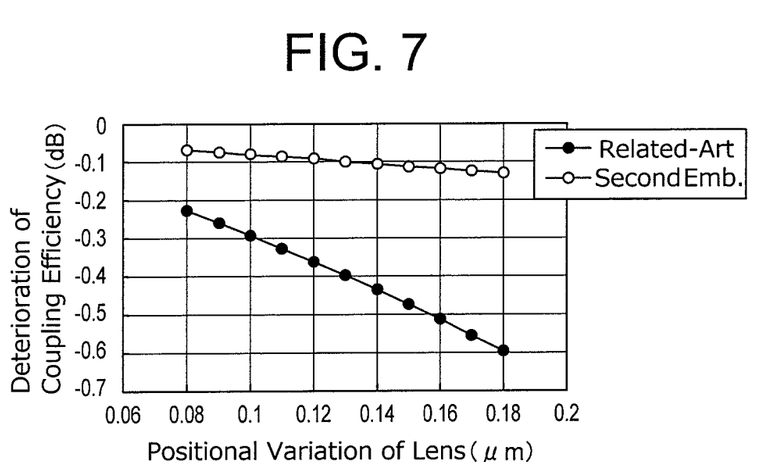
FIG. 7 is a graph for comparison of change in coupling efficiency between the optical module of FIG. 6 and the related-art optical module of FIG. 2.

FIG. 7 is a graph for showing calculation results of the deterioration of coupling efficiency between the semiconductor laser 31 and the optical modulator element 32, which accompanies positional variations of the first lens 41 and the second lens 42. In the graph, the optical module 300 of FIG. 6 and the related-art optical module 200 of FIG. 2 are compared.

As shown in FIG. 7, when the amount of positional variation of the lens is 0.1 μm in the first lens 41 or the second lens 42, the deterioration of coupling efficiency is −0.3 dB in the related-art optical module 200, whereas the deterioration of coupling efficiency is suppressed to −0.08 dB in the optical module 300 according to the second embodiment. When the amount of positional variation of the lens is 0.16 μm, the deterioration of coupling efficiency is −0.5 dB in the related-art optical module 200, whereas the deterioration of coupling efficiency is suppressed to −0.12 dB in the optical module 300.

In the graph of the calculation results shown in FIG. 7, as similar in FIG. 3, it is assumed that the amount of positional variation of the first lens 41 is identical with that of the second lens 42. Further, as to an adhesive resin, curing shrinkage and change over time are positional variations in a direction of the adhesive resin shrinking. Thus, the direction of positional variation is assumed to be the direction in which each of the adhesive resins 51 and 52 is applied, i.e. each of the first bonding direction M3 and the second bonding direction M2.

The configuration of the optical module 300 is not limited to that in the second embodiment.

Figure 8:
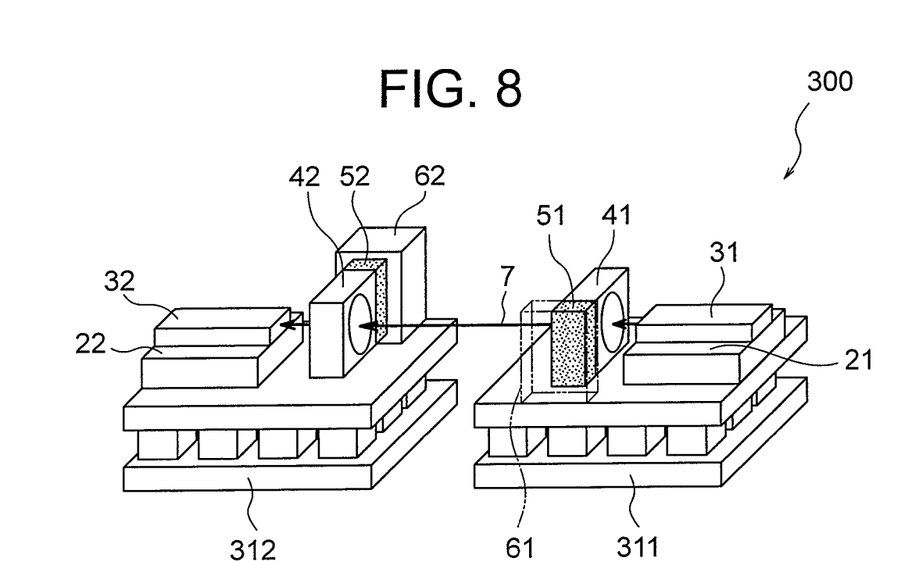
FIG. 8 is a schematic view for illustrating a modification example of the optical module of FIG. 6.

The first substrate 11 and the second substrate 12 may be made of a ceramic material such as alumina or AlN, or made of glass such as quartz, or made of metal. Further, as illustrated in FIG. 8, the base member may be a functional member like TECs 311 and 312.

Also, the materials of the submount substrates 21 and 22 are not limited to a ceramic material such as alumina or AlN.

Further, the light emitter and the light receiver of the optical module 300 are not limited to the combination of the semiconductor laser 31 and the optical modulator element 32, and may be for example a combination of a semiconductor laser and an optical fiber. Further, the combination of the light emitter and the light receiver may be a combination of a semiconductor laser and a light receiving element, or a combination of an optical fiber and a light receiving element.

Further, the posts 61 and 62 may be integrally formed with the second substrate 12, or may be formed of other members different from the second substrate 12.

Third Embodiment

Figure 9:
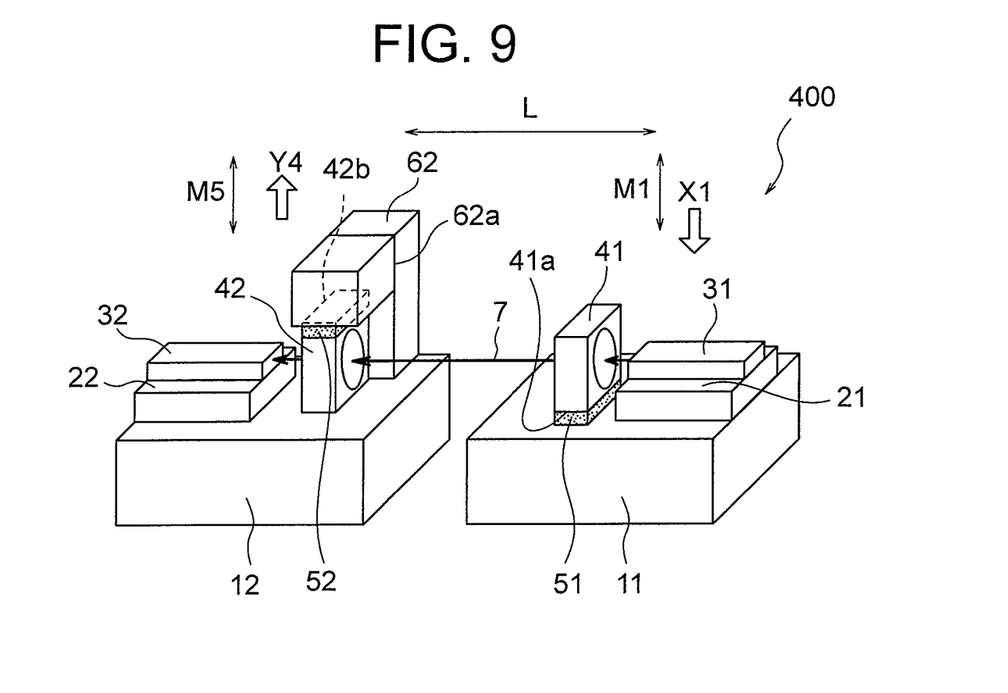
FIG. 9 is a schematic view for illustrating an optical module according to a third embodiment of the present invention.

FIG. 9 is a schematic view for illustrating a configuration of an optical module 400 according to a third embodiment of the present invention.

As illustrated in FIG. 9, the post 62 of the optical module 400 has a lens support portion 62a. The lens support portion 62a is provided above the second lens 42. The second lens 42 has a second bonding surface 42b which is the upper surface thereof. The adhesive resin 52 is provided on the second bonding surface 42b. The second lens 42 is bonded and fixed to the lens support portion 62a via the adhesive resin 52 with suspended from the lens support portions 62a. As similar to the optical module 100, the adhesive resin 51 is provided on the first bonding surface 41a which is the lower surface of the first lens 41, and the first lens 41 is directly bonded and fixed to the first substrate 11 via the adhesive resin 51.

As described above, in the optical module 400 according to the third embodiment, the first bonding direction M1, to which the first bonding surface 41a of the first lens 41 is bonded and fixed, and a second bonding direction M5, to which the second bonding surface 42b of the second lens 42 is bonded and fixed, are respectively along the vertical direction. That is, the first bonding direction M1 and the second bonding direction M5 are respectively perpendicular to the optical axis direction L of the light 7. Further, the orientation X1 of the first bonding surface 41a and the orientation Y4 of the second bonding surface 42b make an angle of 180°. Thus, in the optical module 400 according to the third embodiment, as similar in the optical modules 100 and 300, it is possible to suppress the deterioration of coupling efficiency between the semiconductor laser 31 and the optical modulator element 32.

Further, in the optical module 400, the shape of the post 62 and the thicknesses of the submount substrate 22 and the optical modulator element 32 can be made with high accuracy, and hence the thickness of the adhesive resin 52 can be adjusted with high accuracy. Thus, by designing the adhesive resins 51 and 52 to have a uniform thickness, the amounts of positional variation of the first lens 41 and the second lens 42 due to curing shrinkage or change over time of the adhesive resins 51 and 52 can be made equal.

The suspended structure achieved by the post and the lens support portion is not limited to bond the second lens 42 to the lens support portion on the second substrate 12. It can also be possible to bond the first lens 51 to the lens support portion on the first substrate 11.

Fourth Embodiment

Figure 10:
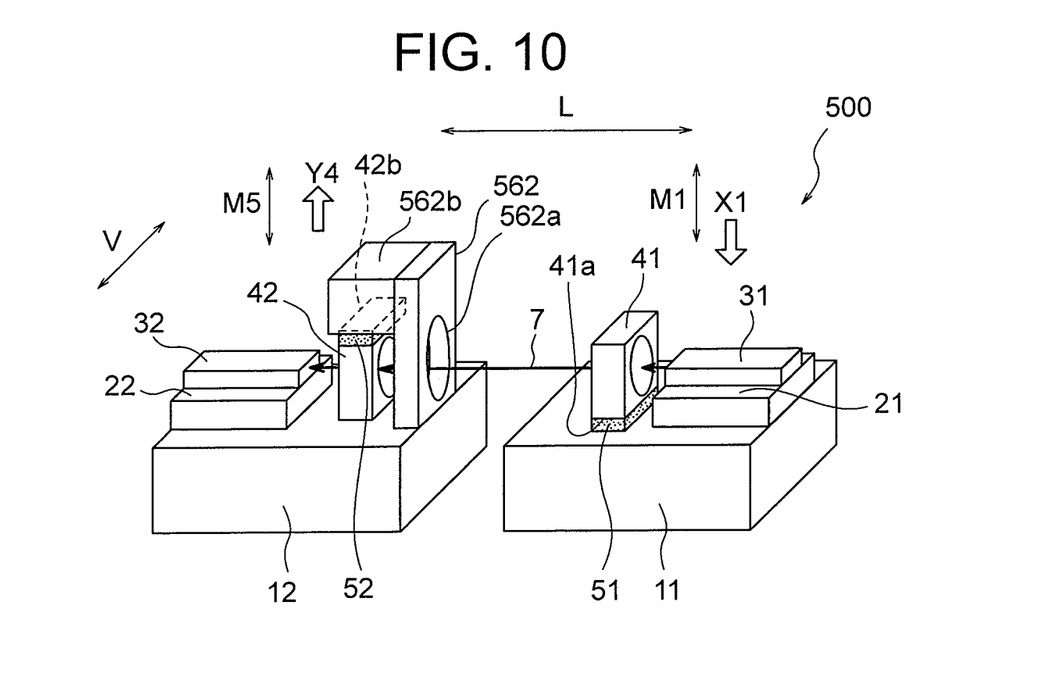
FIG. 10 is a schematic view for illustrating an optical module according to a fourth embodiment of the present invention.

FIG. 10 is a schematic view for illustrating a configuration of an optical module 500 according to a fourth embodiment of the present invention.

As illustrated in FIG. 10, a plate-like post 562 is fixed on the second substrate 12 of the optical module 500. The post 562 is provided on the optical axis of the light 7. Further, the post 562 is provided between the first lens 41 and the second lens 42 along the optical axis direction L of the light 7. The post 562 has a circular opening 562a that allows the light 7 to pass through. A lens support portion 562b is attached on the upper part of the post 562. The second bonding surface 42b of the upper surface of the second lens 42 is directly bonded and fixed to the lens support portion 562b via the adhesive resin 52. The lens support portion 562b is a part of the post 562.

The post 562 and the lens support portion 562b constitute a part of the base member.

As described above, in the optical module 500 according to the fourth embodiment, as similar in the optical module 400, the first bonding direction M1 of the first bonding surface 41a of the first lens 41 and the second bonding direction M5 of the second bonding surface 42b of the second lens 42 are respectively along the vertical direction. That is, the first bonding direction M1 and the second bonding direction M5 are respectively perpendicular to the optical axis direction L of the light 7. Further, the orientation X1 of the first bonding surface 41a and the orientation Y4 of the second bonding surface 42b make an angle of 180°. Thus, in the optical module 500 according to the fourth embodiment, as similar in the optical modules 100, 300, and 400, it is possible to suppress the deterioration of coupling efficiency between the semiconductor laser 31 and the optical modulator element 32.

With the post 562 has the opening 562a that allows the light 7 to pass through, the post 562 can be provided between the first lens 41 and the second lens 42 along the optical axis direction L of the light 7. It is therefore possible to ensure a wider space on the upper surface of the second substrate 12 with respect to the lateral direction V perpendicular to the optical axis direction L of the light 7. With this structure, a plurality of lenses and semiconductor elements can be arranged more closely along the lateral direction V, and hence the configuration of the optical module 500 can be applicable to a parallel integrated optical module, for example a multi-lane integrated optical module.

As similar in the optical module 400, the suspended structure achieved by the post and the lens support portion is not limited to bond the second lens 42 to the lens support portion on the second substrate 12. It can also be possible to bond the first lens 41 to the lens support portion on the first substrate 11.

Fifth Embodiment

Figure 11:
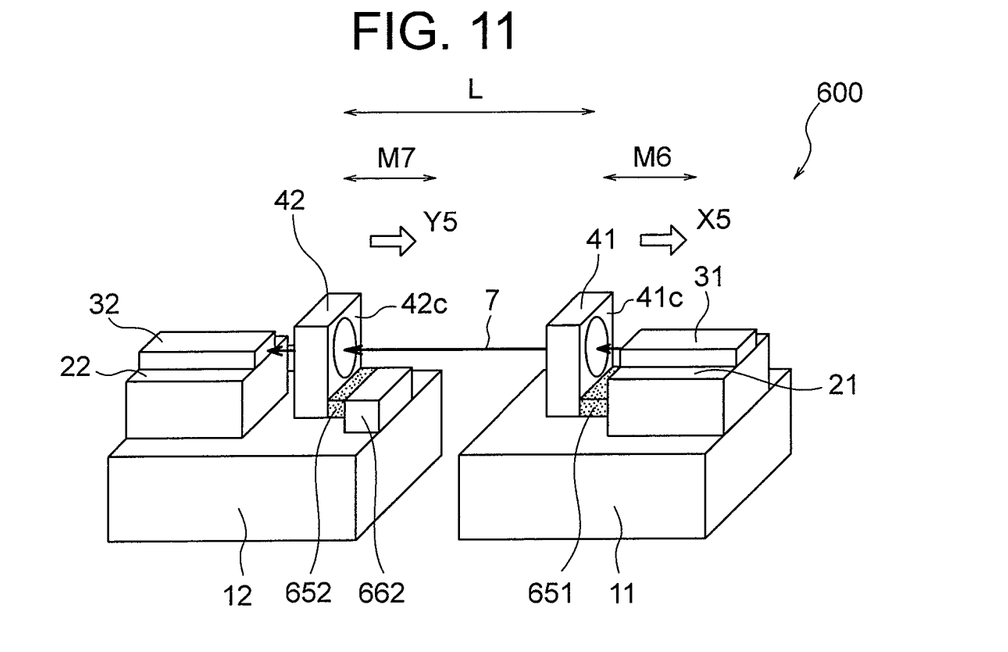
FIG. 11 is a schematic view for illustrating an optical module according to a fifth embodiment of the present invention.

FIG. 11 is a schematic view for illustrating a configuration of an optical module 600 according to a fifth embodiment of the present invention.

As illustrated in FIG. 11, a cuboid post 662 is provided on the second substrate 12 of the optical module 600. The post 662 is provided between the first lens 41 and the second lens 42 along the optical axis direction L of the light 7. The height of the post 662 is lower than that of the travel path of the light 7. Thus, the post 662 does not block the travel of the light 7.

An adhesive resin 651 is applied at the lower part of the first lens 41, and the first lens 41 is bonded and fixed to the submount substrate 21 via the adhesive resin 651. That is, the first lens 41 is fixed to the first substrate 11 through the adhesive resin 651 and the submount substrate 21. In this example, the surface of the first lens 41, on which the adhesive resin 651 is provided, is defined as a "first bonding surface 41c". A first bonding direction M6, in which the first bonding surface 41c is bonded and fixed, is identical with the optical axis direction L of the light 7. Further, an orientation X5 of the first bonding surface 41c is opposite to the semiconductor laser 31 from which the light 7 is emitted.

An adhesive resin 652 is applied at the lower part of the second lens 42, and the second lens 42 is bonded and fixed to the post 662 via the adhesive resin 652. That is, the second lens 42 is fixed to the second substrate 12 through the adhesive resin 652 and the post 662. In this example, the surface of the second lens 42, on which the adhesive resin 652 is provided, is defined as a "second bonding surface 42c". A second bonding direction M7, in which the second bonding surface 42c is bonded, is identical with the optical axis direction L of the light 7. Further, the orientation Y5 of the second bonding surface 42c of the second lens 42 is opposite to the first lens 41. That is, the orientation X5 of the first bonding surface 41c of the first lens 41 is identical with the orientation Y5 of the second bonding surface 42c of the second lens 42.

As described above, in the optical module 600 according to the fifth embodiment, the first bonding direction M6 of the first bonding surface 41c of the first lens 41 and the second bonding direction M7 of the second bonding surface 42c of the second lens 42 are respectively identical with the optical axis direction L of the light 7. Thus, even if the volumes of the adhesive resins 651 and 652 change due to curing shrinkage and change over time of the adhesive resins 651 and 652, and then the positional variations of the first lens 41 and the second lens 42 occur, the loss of incident light intensity can be reduced. Accordingly, it is possible to suppress the deterioration of coupling efficiency between the semiconductor laser 31 and the optical modulator element 32. This is because the fact that the deterioration of coupling efficiency accompanying the positional variations of the first lens 41 and the second lens 42 is minimized when the positional variations of the first lens 41 and the second lens 42 occur along the optical axis direction L of the light 7.

Sixth Embodiment

Figure 12:
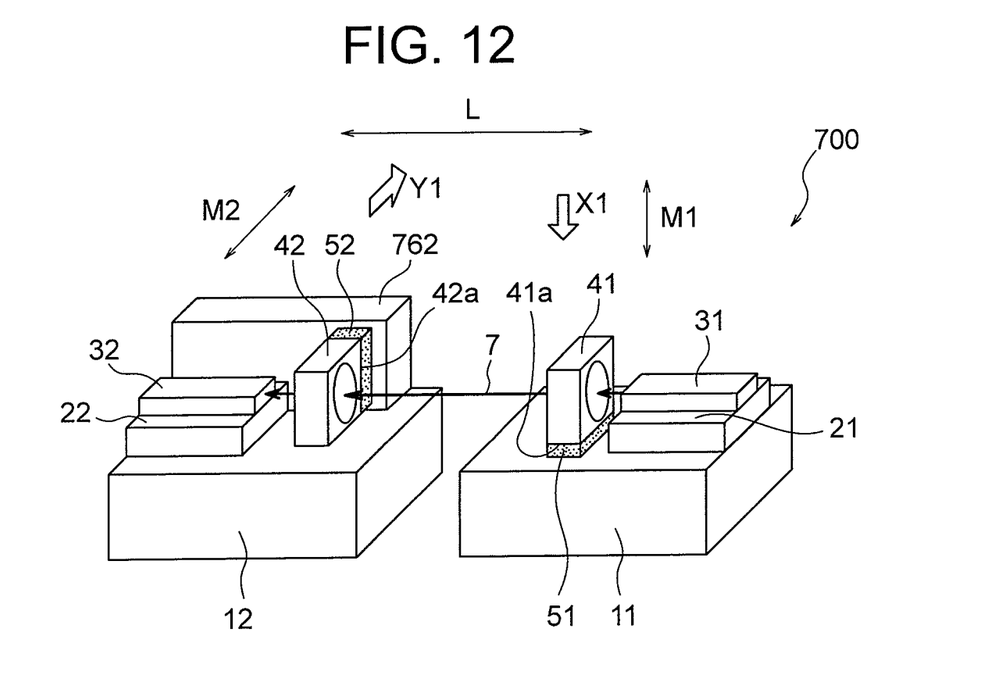
FIG. 12 is a schematic view for illustrating an optical module according to a sixth embodiment of the present invention.

FIG. 12 is a schematic view for illustrating a configuration of an optical module 700 according to a sixth embodiment of the present invention.

As illustrated in FIG. 12, a plate-like post 762 is provided on the second substrate 12 of the optical module 700. The post 762 is provided on one side of the upper surface of the second substrate 12 along the optical axis direction L of the light 7. The post 762 extends to reach the vicinity of the region in which the optical modulator element 32 is mounted. The second lens 42 is bonded to the post 762 via the adhesive resin 52 which is applied to the second bonding surface 42a. Further, the submount substrate 22 is in contact with the post 762.

As described above structure, in the optical module 700 according to the sixth embodiment, as similar in the optical module 100, the first bonding direction M1 of the first bonding surface 41a of the first lens 41 and the second bonding direction M2 of the second bonding surface 42a of the second lens 42 are respectively perpendicular to the optical axis direction L of the light 7. Further, the orientation X1 of the first bonding surface 41a and the orientation Y1 of the second bonding surface 42a make an angle of 90°. Thus, in the optical module 700 according to the sixth embodiment, as similar in the optical module 100 according to the first embodiment, it is possible to suppress the deterioration of coupling efficiency between the semiconductor laser 31 and the optical modulator element 32.

Further, the post 762 extends along the optical axis direction L of the light 7 to be provided on one side of the upper surface of the second substrate 12. Therefore, it is possible to determine the position of the optical modulator element 32 with respect to the second substrate 12 by pushing the optical modulator element 32 indirectly against the post 762 through the submount substrate 22. Accordingly, the optical modulator element 32 can be positioned with high accuracy with respect to the post 762, and hence the second lens 42 can be positioned reliably with respect to the post 762. As a result, the thickness of the adhesive resin 52 for fixing the second lens 42 can be determined uniquely. Meanwhile, the thickness of the adhesive resin 51 is determined uniquely depending on the thicknesses of the semiconductor laser 31 and the submount substrate 21. Thus, the components can be mounted so that the adhesive resins 51 and 52 have the same thickness, through use of such a simple method as pressing against a target component.

Also, a post can be provided on the first substrate 11, and the submount substrate 21 is pressed against the post so as to position the semiconductor laser 31.

Further, when different posts are to be provided on the first substrate 11 and the second substrate 12, the post against which the submount substrate 21 having mounted thereon the semiconductor laser 31 is to be pressed, and the post 762 against which the submount substrate 22 having mounted thereon the optical modulator element 32 is to be pressed, may be arranged to be opposite to each other across the optical axis of the light 7. With this arrangement, the first lens 41 and the second lens 42 are bonded to have orientations making an angle of 180°, and hence it is possible to suppress the deterioration of coupling efficiency more reliably.

Figure 13:
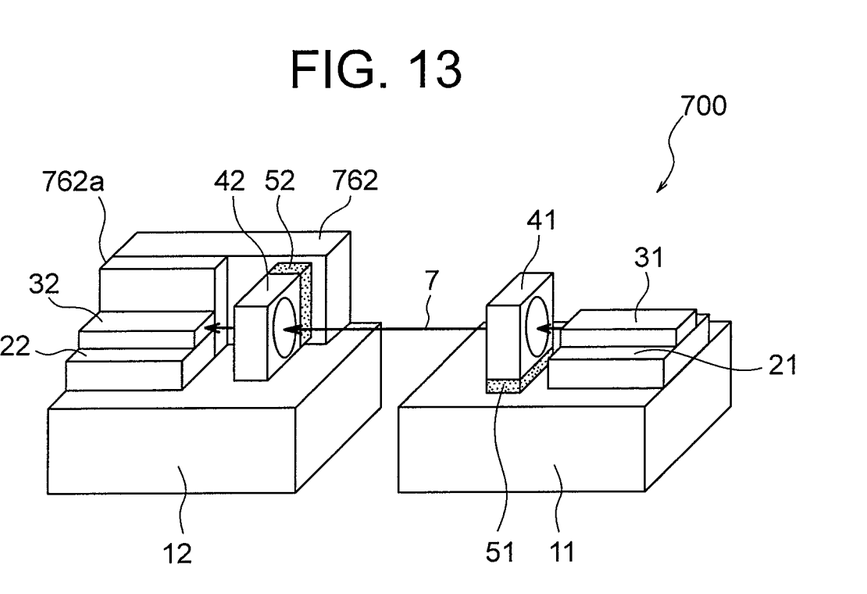
FIG. 13 is a schematic view for illustrating a modification example of the optical module of FIG. 12.

FIG. 13 is a schematic view for illustrating a modification example of the optical module 700 of FIG. 12. As illustrated in FIG. 13, it is also possible to mount a post auxiliary member 762a to the post 762 of the optical module 700. With this structure, the optical modulator element 32 can be directly in contact with the post auxiliary member 762a of the post 762, to thereby enable positional adjustment with higher accuracy.

REFERENCE SIGNS LIST 7 light, 11 first substrate (base member), 12 second substrate (base member), 21, 22 submount substrate (base member), semiconductor laser (light emitter), 32 optical modulator element (light receiver), 41 first lens, 41a, 41b, 41c first bonding surface, 42 second lens, 42a, 42b, 42c second bonding surface, 51, 52, 651, 652 adhesive resin, 62, 562 post (base member), 562a opening, 100, 300, 400, 500, 600, 700 optical module, L optical axis direction of light, M1, M3, M6 first bonding direction, M2, M5 second bonding direction, X1, X3, X5 orientation of first bonding surface, Y1, Y4, Y5 orientation of second bonding surface.

The invention claimed is:

1. An optical module, comprising:
    a light emitter configured to emit a light;
    a light receiver configured to receive the light emitted from the light emitter;
    a first lens and a second lens, which are provided between the light emitter and the light receiver, and which are aligned in an optical axis direction of the light emitted from the light emitting unit; and
    a base member on which the light emitter and the light receiver are placed, and each of the first lens and the second lens is fixed via a layer of adhesive resin having a predetermined thickness,
    wherein the first lens has a first bonding surface, and the first bonding surface being an only portion of the first lens bonded to the base member via the layer of adhesive resin so that the first lens is fixed to the base member,
    wherein the second lens has a second bonding surface, and the second bonding surface being an only portion of the second lens bonded to the base member via the layer of adhesive resin so that the second lens is fixed to the base member,
    wherein a first bonding direction being a stacking direction of the first bonding surface of the first lens and the layer of adhesive resin, and a second bonding direction being a stacking direction of the second bonding surface of the second lens and the layer of adhesive resin are respectively perpendicular to the optical axis direction of the light, and
    wherein an orientation of the first bonding surface and an orientation of the second bonding surface are different from each other.

2. The optical module according to claim 1, wherein the orientation of the first bonding surface and the orientation of the second bonding surface make an angle of 180°.

3. The optical module according to claim 1,
    wherein the base member has a post provided between the first lens and the second lens.

wherein at least one of the first bonding surface of the first lens or the second bonding surface of the second lens is fixed to the post via the layer of adhesive resin, and wherein the post has an opening that allows the light to pass through.

4. The optical module according to claim 1, wherein the base member has a post, wherein at least one of the first bonding surface of the first lens or the second bonding surface of the second lens is fixed to the post via the layer of adhesive resin, and wherein the light emitter or the light receiver is positioned with respect to the post by the layer of adhesive resin.

5. The optical module according to claim 1, wherein the base member is a thermos-electric cooler having a temperature adjustment function.

6. The optical module according to claim 1, wherein the base member has a heat conductivity equal to or higher than 100 W/m/K.

* * * * *